United States Patent [19]

Takabayashi et al.

[11] Patent Number: 5,262,227

[45] Date of Patent: Nov. 16, 1993

[54] AROMATIC POLYIMIDE FILM LAMINATED WITH METAL FOIL

[75] Inventors: Seiichirou Takabayashi; Katsuo Imatani; Kazuaki Mii; Shuji Watakabe, all of Yamaguchi, Japan

[73] Assignee: Ube Industries, Ltd., Yamaguchi, Japan

[21] Appl. No.: 707,570

[22] Filed: May 30, 1991

[30] Foreign Application Priority Data

May 30, 1990 [JP] Japan .................. 2-138356
May 30, 1990 [JP] Japan .................. 2-138357

[51] Int. Cl.$^5$ .......... B32B 7/02; B32B 15/08; B29C 47/00
[52] U.S. Cl. .................. 428/215; 156/244.24; 156/249; 428/216; 428/458; 428/473.5
[58] Field of Search .......... 428/458, 473.5, 215, 428/216; 156/244.24, 249

[56] References Cited

U.S. PATENT DOCUMENTS 4,788,098 11/1988 Sado et al. .................. 428/473.5
4,931,365 6/1990 Inoue et al. .................. 428/458

Primary Examiner—Thomas J. Herbert, Jr.
Attorney, Agent, or Firm—McAulay Fisher Nissen Goldberg & Kiel

[57] ABSTRACT

An aromatic polyimide film directly laminated with a metal foil and an aromatic polyimide film directly laminated on both sides with a metal foil wherein the polyimide film (substrate) comprises an aromatic polyimide layer-A of 6–200 μm thick whose polyimide is derived from a biphenyltetracarboxylic acid or its derivative and a phenylenediamine and an aromatic polyimide layer-B of 0.2–15 μm thick whose polyimide is derived from an aromatic tetracarboxylic acid or its derivative and an aromatic diamine having plural benzene rings, and the polyimide layer-A has a thickness of not less than 55% of the total thickness of the aromatic polyimide substrate film, the polyimide layer-B is fixed to the polyimide layer-A under the condition that the layer-B cannot be peeled from the layer-A along the interface between these layers-A and -B and the metal foil is directly fixed on the surface of the polyimide layer-B via no adhesive.

5 Claims, 4 Drawing Sheets

AROMATIC POLYIMIDE FILM LAMINATED WITH METAL FOIL

BACKGROUND OF THE INVENTION

1. Field of the Invention

The present invention relates to an aromatic polyimide film directly laminated on one side or on both sides with a metal foil, and processes for preparing the aromatic polyimide film directly laminated with a metal foil.

2. Description of Prior Art

Heat-resistant plastic films (e.g., aromatic polyimide films) laminated with a metal foil are utilized, for instance, for the manufacture of flexible circuit printed boards. Most of known aromatic polyimide films laminated with a metal foil (i.e., composite film) are prepared by combining an aromatic polyimide film and a metal foil using a thermosetting adhesive. The thermosetting adhesive used for combining an aromatic polyimide film and a metal foil is not satisfactorily heat resistant such that the adhesive is able to hold its adhesiveness only up to 200° C. Therefore, most of the known adhesives cannot be employed for the preparation of composite films which are to be subjected to high temperature heat treatment such as soldering or used under high temperatures conditions.

In view of the above problem, several studies have been performed for investigating adhesives having sufficiently high heat resistance. However, heretofore reported adhesives are not practically employable, because some of which require high temperatures for their uses in combining the materials and others require very complicated procedures in their uses. Moreover, in most cases, the composite films obtained by the use of these adhesives hardly show enough adhesiveness in their uses.

In other approaches, composite films having no adhesive layer, that is, aromatic polyimide films directly laminated with a metal foil without use of an adhesive have been studied. For instance, the preparation of a composite film by casting a solution of an aromatic polyimide precursor (i.e., aromatic polyamic acid) on a metal foil and processing the cast layer to form an aromatic polyimide film layer on the metal foil is known. Also known is a process in which an aromatic polyimide film is plated or vapor-deposited with a metal on its surface. The former process utilizing the solution casting has such drawbacks that it is extremely difficult to produce the aromatic polyimide film layer having enough thickness and that a very long time of period is required for removing the solvent or volatile products produced from the film in the course of the film preparation. The process utilizing metal-plating or vapor-deposition also has drawback such that the formation of a metal layer having enough thickness is very difficult.

Japanese Patent Provisional Publication 62(1987)-53827 describes lamination of a metal foil on a thermoplastic polyimide film to prepare a composite film.

Japanese Patent Provisional Publication 62(1987)-104840 and Japanese Patent Publication 61(1986)-15825 describe the preparation of composite films by thermally combining under pressure a metal foil, an aromatic polyimide film having a second-order transition point (Tg) and a highly heat resistant aromatic polyimide film.

However, the composite film prepared using the above mentioned thermoplastic polyimide or the polyimide having Tg shows unsatisfactory heat resistance or thermal dimensional stability in its polyimide film or shows low adhesiveness when it is subjected to high temperature treatments such as treatment in solder bath.

Japanese Patent Provisional Publication Hei-2(1990)-373 describes an aromatic polyimide having high heat resistance and high dimensional stability which is prepared from a biphenyltetracarboxylic acid or its derivative and a phenylenediamine. However, even if the aromatic polyimide having high heat resistance and high dimensional stability is employed as a substrate film for the preparation of the composite film, the poor adhesiveness at high temperatures of the known adhesives still does not allow the preparation of the desired composite film having high heat resistance.

In copending U.S. Patent Application Ser. No. 7/624,043, there is disclosed an extruded multi-layer polyimide film which comprises:

at least one thin layer with a thickness of not more than 10 μm comprising an aromatic polyimide derived from an aromatic tetracarboxylic acid compound and an aromatic diamine having two or more benzene rings; and a base layer comprising an aromatic polyimide derived from a biphenyltetracarboxylic acid compound and a phenylene diamine, the at least one thin layer being unitarily arranged on at least one side of the base layer.

SUMMARY OF THE INVENTION

It is an object of the present invention to provide a novel aromatic polyimide film directly laminated with a metal foil using no adhesive, which has high heat resistance.

It is another object of the invention to provide a aromatic polyimide film directly laminated with a metal foil using no adhesive, which is highly resistant to heat even when it is subjected to heat treatment at temperatures of higher than 200° C.

It is a further object of the invention to provide a aromatic polyimide film directly laminated with a metal foil using no adhesive, which is highly resistant even when it is treated in a solder bath.

There is provided by the invention an aromatic polyimide film laminated with a metal foil which comprises an aromatic polyimide substrate film comprising an aromatic polyimide layer (layer-A) of 6–200 μm thick whose polyimide is derived from a biphenyltetracarboxylic acid or its derivative and a phenylenediamine and an aromatic polyimide layer (layer-A) of 0.2–15 μm thick (preferably 0.3–15 μm thick) whose polyimide is derived from an aromatic tetracarboxylic acid or its derivative and an aromatic diamine having plural benzene rings, the former aromatic polyimide layer (layer-A) having a thickness of not less than 55% of the total thickness of the aromatic polyimide substrate film and the latter polyimide layer (layer-B) being fixed to the former polyimide layer (layer-A) under the condition that the latter layer (layer-B) cannot be peeled from the former layer (layer-A) along the interface between these layers (layer-A and layer-B), and a metal foil which is directly fixed on the surface of the latter aromatic polyimide layer (layer-B) with no adhesive.

DETAILED DESCRIPTION OF THE INVENTION

Figure 1:
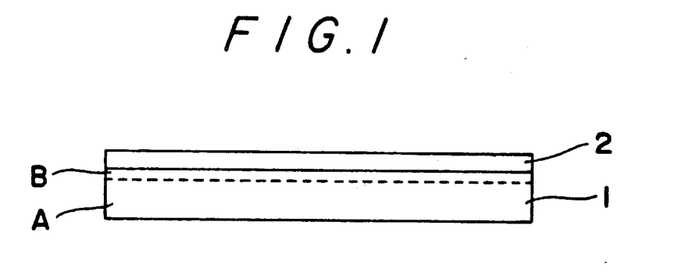
FIG. 1 shows a typical aromatic polyimide film laminated with a metal foil according to the present invention.
Figure 2:
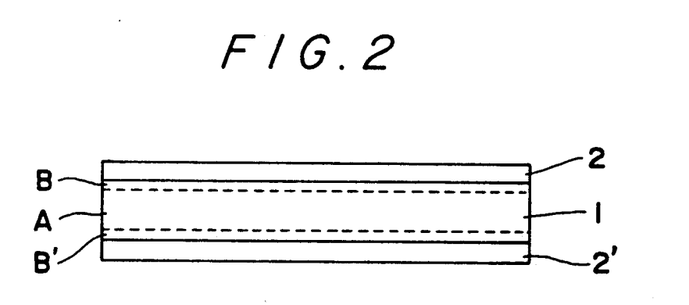
FIG. 2 shows another typical aromatic polyimide film laminated on both sides with a metal foil according to the invention.

The typical constitutions of the aromatic polyimide films laminated with a metal foil according to the invention are illustrated in FIG. 1 and FIG. 2 of the attached drawings.

One typical aromatic polyimide film laminated with a metal foil comprises an aromatic polyimide substrate film 1 and a metal foil 2. The substrate film 1 comprises a layer-A and a layer-B. The layer-A has a thickness in the range of 6 to 200 $\mu$m and the aromatic polyimide of the layer-A is derived from a biphenyltetracarboxylic acid (or its derivative) and a phenylenediamine. The layer-B has a thickness in the range of 0.2 to 15 $\mu$m (preferably 0.3 to 15 $\mu$m) and the polyimide of the layer-B is derived from an aromatic tetracarboxylic acid (or its derivative) and an aromatic diamine having plural (i.e., two or more) benzene rings in its molecular structure. Moreover, the layer-A has a thickness of not less than 55% of the total thickness of the aromatic polyimide substrate film. The layer-B is fixed to the layer-A under the condition that the layer-B cannot be peeled from the layer-A along the interface between these layers. The interface is shown by the dotted line. The metal foil 2 is directly fixed on the surface of the layer-B with no adhesive.

FIG. 2 shows another typical polyimide film laminated with a metal foil which comprises an aromatic polyimide substrate film 1, a metal foil 2 and another metal foil 2'. The substrate film 1 comprises a layer-A, a layer-B and a layer-B'. As to the layer-A, layer-B and metal foil 2, the descriptions set forth above for FIG. 1 are applied to those seen in FIG. 2. The layer-B' has a thickness in the range of 0.2-15 $\mu$m (preferably 0.3-15 $\mu$m) and the polyimide is derived from an aromatic tetracarboxylic acid (or its derivative) and an aromatic diamine having plural benzene rings. The layer-B' is fixed to the layer-A on the other side (i.e., free surface) likewise under the condition that the layer-B' cannot be peeled from the layer-A along the interface between these layers. The interface is shown by the dotted line. The metal foil 2' is directly fixed on the surface of the layer-B' with no adhesive.

The polyimide film directly laminated with a metal foil according to the invention can be prepared using the aromatic polyimide substrate film and a metal foil or a couple of metal foils.

Figure 3:
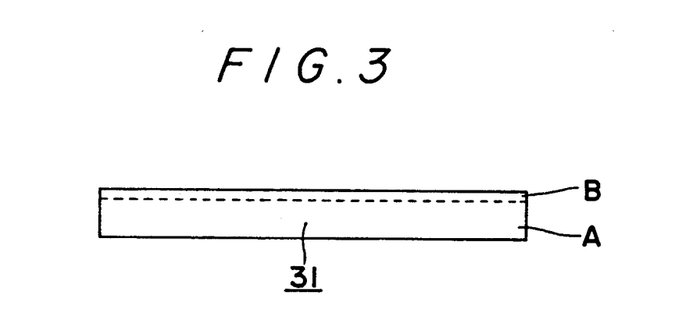
FIG. 3 shows a typical aromatic polyimide substrate film comprising a layer-A and a layer-B, which are combined under the specific condition.
Figure 4:
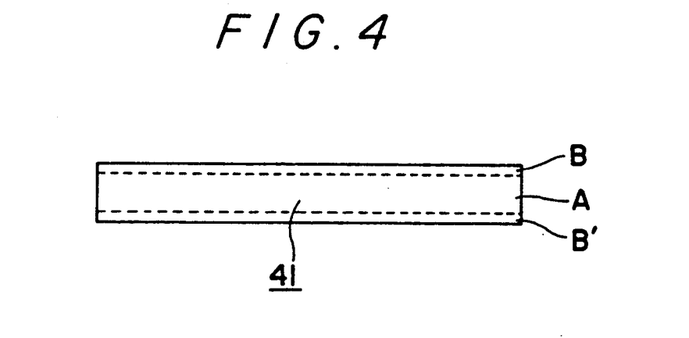
FIG. 4 shows another typical aromatic polyimide substrate film comprising a layer-B, a layer-A and a layer-B', which are combined under the specific condition between adjoining layers.

The typical aromatic polyimide substrate films are illustrated in FIGS. 3. The polyimide substrate film 31 of FIG. 3 has the layer-A and layer-B, whose descriptions are given in the descriptions of FIG. 1. The polyimide substrate film 41 of FIG. 4 has the layer-A, layer-B, and layer-B', whose descriptions are given in the descriptions of FIG. 2. In the case of the three-layers film, the layer-B and the layer-B' preferably have almost the same thickness (such as within the range of 0.8-1.2, more preferably 0.9-1.1, in the term of B/B' in thickness) so as to show low curling tendency.

The aromatic polyimide substrate film 31 can be prepared by a process as described in the copending U.S. Patent Application Ser. No. 07/624,043 which comprises the steps of:

feeding both a first aromatic polyamic acid solution and a second aromatic polyamic acid solution simultaneously to an extrusion molding machine having an extrusion molding die, the first aromatic polyamic acid solution comprising an aromatic polyamic acid in a solvent, said aromatic polyamic acid being derived from an aromatic tetracarboxylic acid or its derivative and an aromatic diamine having plural benzene rings, and the second aromatic polyamic acid solution comprising an aromatic polyamic acid in a solvent, said aromatic polyamic acid being derived from a bipheneyltetracarboxylic acid or its derivative and a phenylene diamine;

extruding continously both solutions from an outlet of the die in the form of a thin film consisting of two layers onto a planar support;

drying the extruded thin film on the support to form a self-supportable multi-layer film;

peeling the multi-layer film from the support; and subjecting the multi-layer film to heat-treatment.

Figure 5:
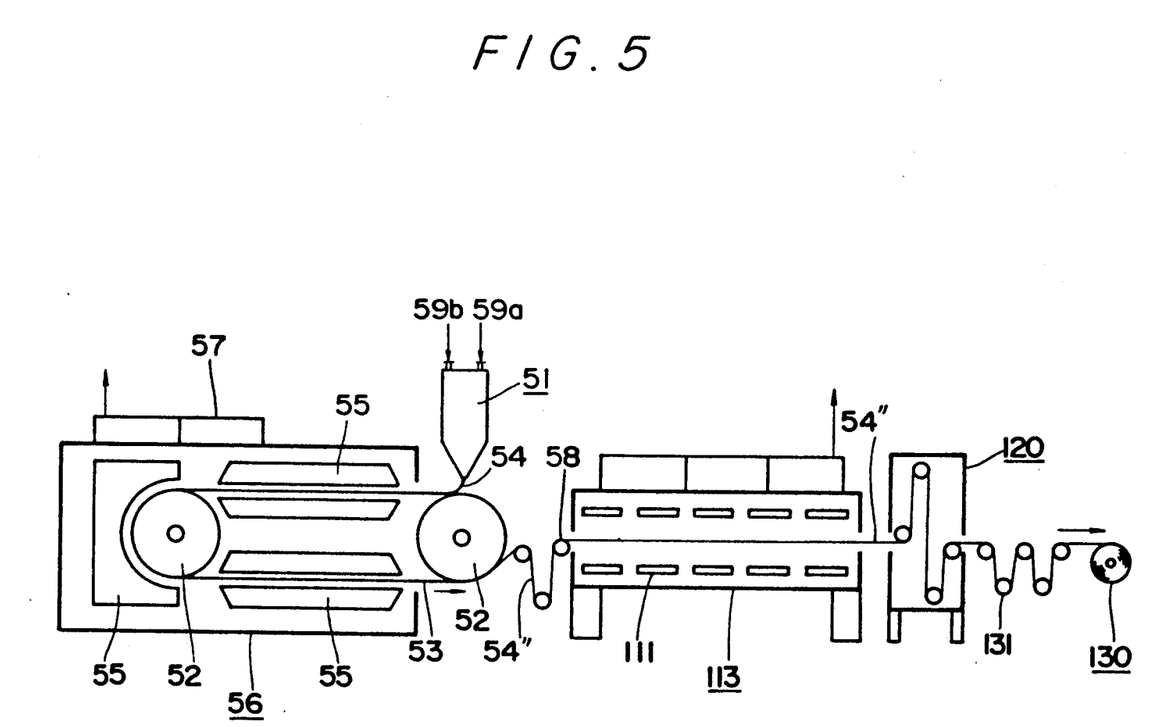
FIG. 5 shows a casting machine employable for the preparation of the aromatic polyimide substrate film.

Details of the above-mentioned process are described below referring to the casting machine of FIG. 5 and the dies of FIGS. 6 and 7.

At first, a first aromatic polyamic acid solution (a) and a second aromatic polyamic acid solution (b) are fed simultaneously through inlets of polymer solutions 59a, 59b, respectively, to an extrusion molding machine having an extrusion molding die 51, subsequently both solutions are extruded continuously from an outlet of the die 51 in the form of a thin film of two layers onto a surface of a planar support 53 (e.g., metal belt) which is cyclically moved between and around a pair of drive wheels (reelers) 52. In a casting oven 56, the thin film 54 extruded on the support 53 is dried to an appropriate extent using a heater 55 or a hot-air blower 57 to form a self-supporting film 54', subsequently the film is peeled from the support and finally, the self-supporting film 54' is subjected to heat treatment by passing through a curing oven 113 within which plural heaters 111 are mounted, whereby the two-layer aromatic polyimide film 54" is formed. Then, the film is cooled to room temperature (approx. 0°-50° C.) in a refrigeration chamber 120 and is rolled up on a wind-up roll 130 in a wind-up machine 131 (its portion is only illustrated).

Figure 6:
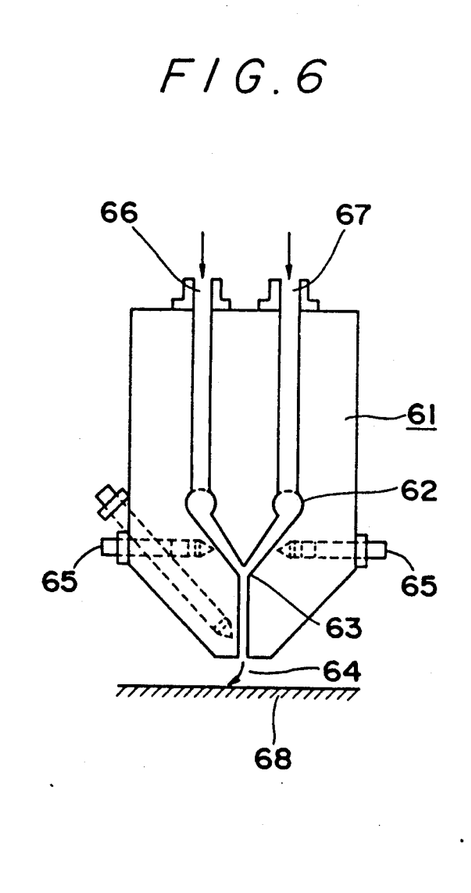
FIG. 6 shows a die employable for the preparation of the aromatic polyimide substrate film.

As the above extrusion molding die for the extrusion of a two-layer film, there can be mentioned a die as illustrated in FIG. 6. In FIG. 6, the extrusion molding die 61 is provided with inlets 66, 67 of polymer solutions and flow paths of the polymer solutions are formed from each inlet toward respective manifolds 62. The flow paths join at the juncture 63 through the bottom of the manifolds 62, and the joined flow paths (lip portion) of the polymer solutions lead to an outlet 64. Thus, the extrusion molding die shown in FIG. 6 has such a structure that the polymer solution is extruded onto a support 68 in the form of a thin film.

In the above die shown in FIG. 6, the lip portion has such a structure that its clearance can be adjusted with a lip set bolt. In the bottom portion of each manifold (in the vicinity of the juncture), the clearance of the space of each flow path is adjusted with each choke bar 65. Each of the manifolds is preferred to have a shape of a hanger coating type.

Figure 7:
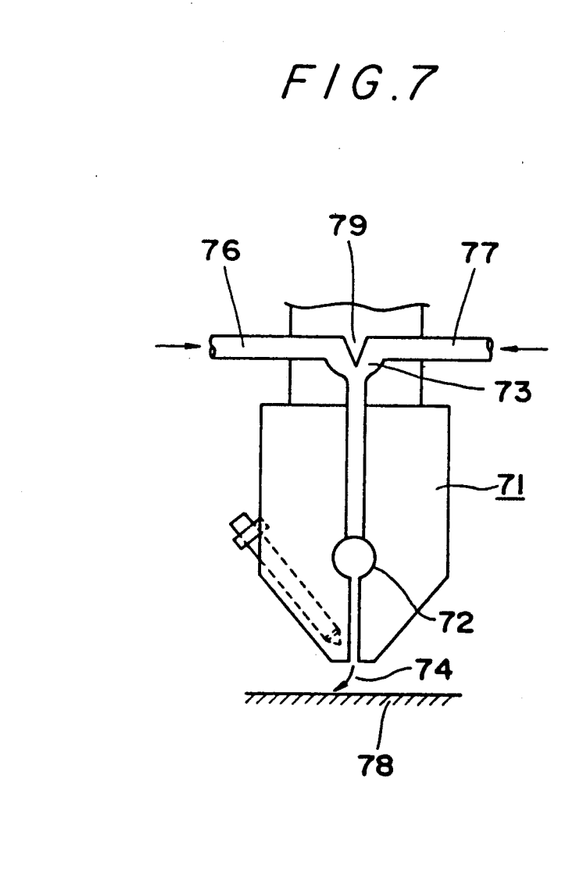
FIG. 7 shows a die employable for the preparation of the aromatic polyimide substrate film.

As the extrusion molding die for the extrusion of a two-layer film, there can be also mentioned a die as illustrated in FIG. 7. In FIG. 7, the extrusion molding die 71 is provided with inlets 76, 77 of polymer solutions at left and right sides of its upper portion. Both flow paths of the polymer solutions join at the juncture 73 provided with a dash board 79, and the flow path is formed so as to lead from the juncture of a manifold 72. The flow path of the bottom of the manifold 72 leads to an outlet 74 in the form of a slit. Thus, the extrusion molding die illustrated in FIG. 7 has such a structure that the polymer solution is extruded onto a support 78 in the form of a thin film.

In the above process, using an extrusion molding die for a three-layer film instead of the above-mentioned die for a two-layer film, an extruded multi-layer polyimide film having two layers-B and -B' on both sides of the layer-A can be produced in the same manner as stated in the above-mentioned two-layer extrusion molding.

Microscopic observation have revealed that the two-layer film and three-layer film obtained above have one and two interfaces, respectively, between layers. The intefaces have sections in the form of a belt composed of fish scales aligned along the interface. Each layer of the two-layer film and three-layer film, however, cannot be separated from adjoining layer along the interface. In this sence, the two layers and the three layers of the two-layer film and the three-layer film, respectively, are combined to give an inseparably united article.

The materials of the layer A and the layers B and B' are described below.

The layer A is made of an aromatic polyimide which is derived from a biphenyltetracarboxylic acid or its derivative and a phenylenediamine. Examples of the biphenyltetracarboxylic acid are 3,3',4,4'-biphenyltetracarboxylic acid and 2,3,3',4'-biphenyltetracarboxylic acid. Examples of their derivatives are their acid anhydrides and their esters. Their acid dianhydrides are preferred. These biphenyltetracarboxylic acids or their derivatives can be used in combination with other aromatic tetracarboxylic acids (e.g., pyromellitic acid and 3,3',4,4'-benzophenonetetracarboxylic acid) or their derivatives (e.g., dianhydride), provided that the content of the latter acids or derivatives does not exceed 40 molar % of the total content of tetracarboxylic acids and their derivatives. In other words, the biphenyltetracarboxylic acid or its derivative should be contained in the tetracarboxylic acid components in the amount of not less than 60 molar %. It is preferred that the content of the biphenyltetracarboxylic acid or its derivative is not less than 80 molar %. Examples of the phenylenediamine are o-, m-, and p-phenylenediamine. The phenylenediamine also can be used in combination with other aromatic diamines (e.g., 4,4'-diaminodiphenylether, 3,4'-diaminodiphenylether, 4,4'-diaminodiphenylsulfone, and 3,4'-diaminodiphenylsulfone), provided that the content of the other aromatic diamines does not exceed 50 molar % of the total content of aromatic diamines. In other words, the phenylenediamine should be contained in the aromatic diamine components in the amount of not less than 50 molar %. It is preferred that the content of the phenylenediamine is not less than 60 molar %.

The biphenyltetracarboxylic acid or its derivative (and optionally other aromatic tetracarboxylic acid or its derivative) and the phenylenediamine (and optionally other aromatic diamine) are polymerized together to give a polyamic acid and then imidized to give an aromatic polyimide having a high molecular weight in the known manner. The aromatic polyimide preferably has no secondary transition point, because such polyimide shows high heat-resistance, high mechanical strength, and high dimensional stability.

The layer B (also the layer-B') is made of an aromatic polyimide which is derived from an aromatic tetracarboxylic acid or its derivative and an aromatic diamine having two or more benzene rings. Examples of the aromatic tetracarboxylic acid are 3,3',4,4'-biphenyltetracarboxylic acid, 2,3,3',4'-biphenyltetracarboxylic acid, 3,3',4,4'-benzophenonetetracarboxylic acid and 3,3',4,4'-diphenylethertetracarboxylic acid. Examples of their derivatives are their acid anhydrides and their esters. Their acid dianhydrides are preferred. Among these aromatic tetracarboxylic acids and their derivatives, biphenyltetracarboxylic acids or their derivatives are preferably employed. The biphenyltetracarboxylic acid or its derivative can be used in combination with other aromatic tetracarboxylic acids or their derivatives (e.g., dianhydride). In this case, the content of the other acids or derivatives preferably does not exceed 40 molar % of the total content of tetracarboxylic acids and their derivatives. In other words, the biphenyltetracarboxylic acid or its derivative is preferably contained in the tetracarboxylic acid components in the amount of not less than 60 molar %. It is preferred that the content of the biphenyltetracarboxylic acid or its derivative is not less than 80 molar %. Examples of the aromatic diamine having two or more benzene rings are diphenylether-type diamines, diaminodiphenylalkane-type diamines, diphenylsulfone-type diamine, di(aminophenoxy)benzenes, and di[(aminophenoxy)phenyl]sulfones. More specifically, 4,4'-diaminodiphenylether, 3,4'-diaminodiphenylether, 4,4'-diaminodiphenylsulfone, and 3,4'-diaminodiphenylsulfone can be mentioned. These diamines can be used alone or in combination with each other.

The aromatic tetracarboxylic acid or its derivative and the aromatic diamine having two or more benzene rings are polymerized together to give a polyamic acid and then imidized to give an aromatic polyimide in the known manner. The resulting aromatic polyimide preferably has a secondary transition point in the range of 250°-400° C. (more preferably, 260°-360° C.), because such aromatic polyimide shows high heat-resistance as well as high thermal adhesiveness (adhesion using pressure and heat) with a metal foil.

Examples of the metal foils to be used in the invention include foils of electroconductive metals such as iron, aluminum, copper, gold, silver, lead and magnesium, as well as their alloys. A copper foil is preferred. The metal foil preferably has a thickness in the range of 5–100 μm, and more preferably has a thickness in the range of 10–50 μm.

The aromatic polyimide film laminated with a metal foil comprises the aromatic polyimide film (composed of the layer-A and layer-B, and optionally the layer-B') and a metal foil (and optionally other metal foil) which is directly fixed on the surface of the layer-B with no adhesive, as is seen in FIGS. 1 and 2. The metal foil and the polyimide film are combined at an adhesion strength (90°-peeling) of not lower than 0.8 kg/cm, preferably in the range of 0.9–5 kg/cm (at room temperature: 20° C.). The interface on which the peeling takes place is the interface between the layer-B of the polyimide film and the metal foil. Essentially no peeling takes place between the layer-A and layer-B in the polyimide film. Further, the metal foil-laminated polyimide film of the invention shows such high heat-resistance that neither peeling nor swelling takes place on the interface between the polyimide film and the metal foil when the laminated film is placed on a solder bath (approx. 288° C.) for 10 minutes.

The adhesion (fixing) of the metal foil on the polyimide film can be performed by combining the metal foil and the polyimide film with no adhesive (no heat-curing adhesive and no other adhesive) and then pressed with heating under the conditions of a pressure in the range of 20–50,000 kg/cm$^2$ (preferably, 30–30,000 kg/cm$^2$) and a temperature in the range of 280°–550° C. (preferably, 300°–500° C.). The pressing procedure can be performed for approx. 0.1 sec. to 60 minutes, preferably 0.5 sec to 30 minutes, using, for instance, a hot-press. The pressing procedure is preferably performed in an inert atmosphere, using, for instance, a nitrogen gas, a neon gas, or an argon gas, so as to keep the metal foil from thermal deterioration. A covering sheet of a stainless foil, an aluminum foil, or the like can be placed on a copper foil or other metal foils having low heat resistance during the pressing procedure at high temperatures.

According to the invention, a long aromatic polyimide film laminated with a metal foil can be produced. In this case, the film can have a width in the range of 5–200 cm, and can have non-limited continuous length. The production of the continous polyimide film laminated with a metal foil can be described by referring to the press machine illustrated in FIG. 8.

Figure 8:
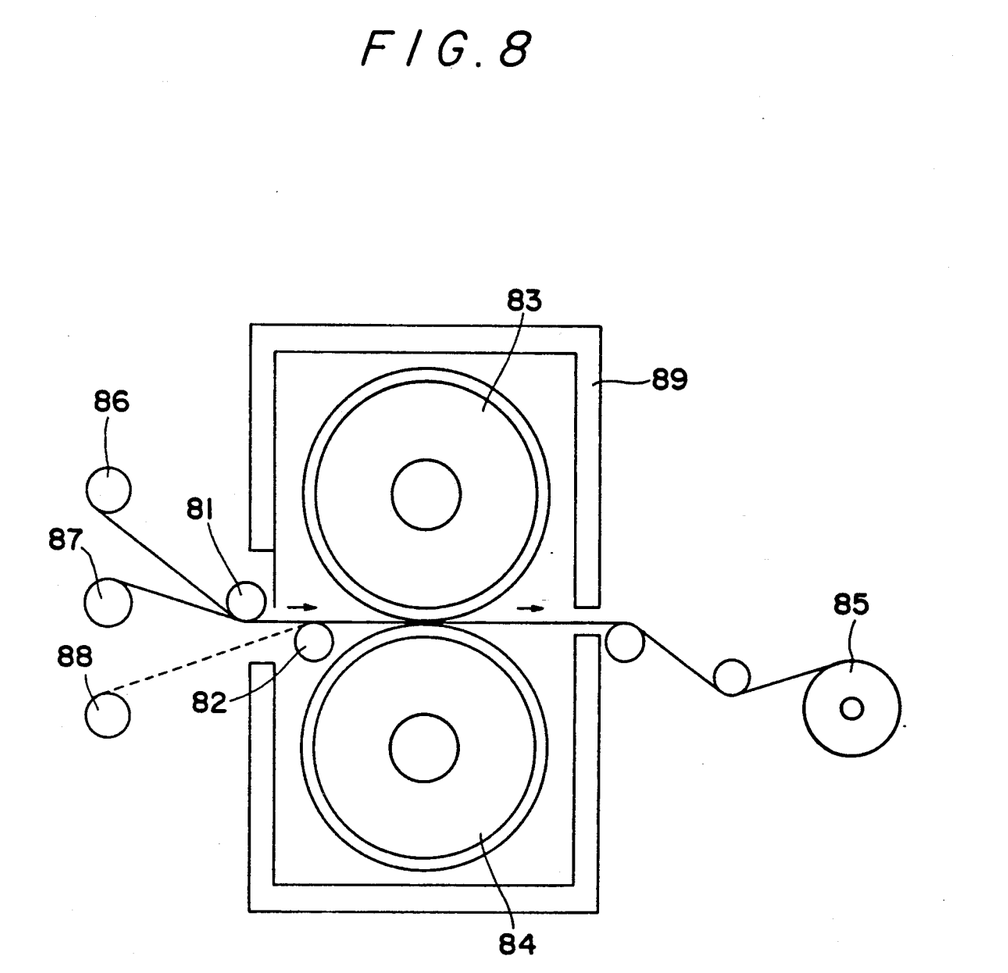
FIG. 8 shows a machine employable for the preparation of the aromatic polyimide film laminated with a metal foil according to the invention.

An aromatic polyimide film composed of the layer-A and layer-B is supplied from a roll 87 under the condition that the layer-B faces above. A metal foil is supplied from a roll 86. The polyimide film and the metal foil are both passed in combination under an expander roll 81 and on a guide roll 82 under the condition of receiving tension and then supplied between a couple of thermal press rolls 83, 84 (rolls of elastic material or metal). By the thermal press rolls, the metal foil is fixed onto the polyimide film to give a laminated film. The laminated film is then continuously wound up around a roll 85 at a winding rate of 1–200 cm/min. (preferably 5–100 cm/min.), if necessary, after it is subjected to cooling treatment.

If the three-layer film as illustrated in FIG. 2 is desired, an aromatic polyimide film composed of the layer -B', layer-A, and layer-B is supplied from the roll 87, and metal foils are supplied from rolls 86, 88. The polyimide film and the two metal foils are processed in the same manner as above to give a laminated sheet having the two metal foils on both sides.

The continuous adhesion (fixing) of the metal foil on the polyimide film can be performed using a couple of thermal press rolls under the conditions of a linear pressure in the range of 10–5,000 kg/cm (preferably, 20–1,000 kg/cm) and a temperature in the range of 280°–550° C. (preferably, 300°–500° C.). The pressing procedure is preferably performed in an inert atmosphere, so as to keep the metal foil from thermal deterioration. A covering sheet of a stainless foil, an aluminum foil, or the like can be preferably placed on a copper foil or other metal foils having low heat resistance during the continuous pressing procedure at high temperatures.

The invention is further described in more detail by the following examples and comparison examples.

The tests for evaluating the laminated films produced in the examples and comparison example were conducted in the following manners.

Tensile test was conducted in accordance with ASTM D-882 to measure tensile strength, elongation (rupture point) and elasticity modules.

Shrinkage factor on heating was determined by measuring a rate of dimensional change when a film sample was heated at 400° C. for 2 hours and then slowly cooled.

Thermal linear expansion coefficient was determined by measuring the thermal expansion of a film sample subjected to heat-treatment at 400° C., over the temperature range 50° to 300° C.

The adhesion strength of the metal laminated film was measured in accordance with "90°-peeling method" of IPC-TM-(2.4.9.).

The resistance to solder of the metal laminated film was determined in accordance with IPC-TM-650 (2.4.13), by placing a sample laminated film on a solder bath maintaining its temperature at 288°±5° C. under the condition that the metal foil of the sample film was kept in contact with a solder for 10 seconds. The evaluation was made by observing whether or not swelling and/or peeling took place on the metal laminated film.

EXAMPLE 1

3,3'4,4'-Biphenyltetracarboxylic dianhydride (s-BPDA) and 4,4'-diaminodiphenylether (DADE) were polymerized in N,N-dimethylacetamide (DMAc) to give a first aromatic polyamic acid solution having a polymer content of 18 weight % and a solution viscosity of 5,000 poises.

Independently, s-BPDA and p-phenylenediamine (PPD) were polymerized to give a second aromatic polyamic acid solution having a polymer content of 18 weight % and a solution viscosity of 4,500 poises.

The first and second polyamic acid solutions were simultaneously extruded through a two-layer extrusion die onto a metal support having a planar surface. The extruded solutions were cast on the support and continuously dried at 140° C. using a blower to give a self-supporting solid film containing 35 weight % of solvent. The solid film was peeled from the support and heated in a heating furnace at temperatures gradually elevating from 200° C. to 550° C., whereby removing the solvent and imidizing the polymer. Thus, a polyimide film consisting of two aromatic polyimide layers was produced. The physical property (tensile strength, shrinkage factor on heating, thermal linear expansion coefficient) of the obtained film is set forth in Table 1.

The obtained film consisted of a high heat-resistant aromatic polyimide layer having no secondary transition point and a thickness of 50 μm (corresponding to layer-A) and an aromatic polyimide layer having a secondary transition point at 285° C. and a thickness of 7.5 μm (corresponding to layer-B).

The polyimide film was placed under the condition that the layer-B faced above. A copper foil of 35 μm thick was placed on the layer-B of the polyimide film. On the copper foil was placed an aluminum foil of 12 μm thick. The resulting composite film was placed in a hot press machine between heating plates, and pressed under the conditions of a temperature of 400° C., a pressure of 400 kg/cm² and a period of time of 5 min., to give a polyimide film laminated with a metal foil.

The resulting metal foil-laminated polyimide film was subjected to measurement of adhesion strength (90°-peeling at room temperature) and resistance to solder. The results are set forth in Table 1.

EXAMPLES 2 and 3

The procedures of Example 1 were repeated except that the heat press conditions were changed as set forth in Table 1, to give a metal foil-laminated polyimide film.

The adhesion strength and resistance to solder of the resulting metal foil-laminated polyimide film are set forth in Table 1.

EXAMPLE 4 and 5

The procedures of Example 1 were repeated except that the rate of extrusion from the two-layer extrusion die was so changed as to give the two layers-A and -B having the thickness set forth in Table 1, to give a metal foil-laminated polyimide film.

The adhesion strength and resistance to solder of the resulting metal foil-laminated polyimide film are set forth in Table 1.

COMPARISON EXAMPLE 1

The procedures of Example 1 were repeated except for extruding the same first aromatic polyamic acid solution through a one-layer extrusion die under the same conditions to give a one-layer aromatic polyimide film having a secondary transition point of 285° C. and a thickness of 50 μm. This film was named "R₁ type".

The physical property of R₁ type film is set forth in Table 1.

The lamination procedure of Example 1 were then repeated except that the R₁ type film was used and the pressure for adhesion was changed to 100 kg/cm², to give a metal foil-laminated polyimide film.

The adhesion strength and resistance to solder of the resulting metal foil-laminated polyimide film are set forth in Table 1.

COMPARISON EXAMPLE 2

The procedures of Example 1 were repeated except that the rate of extrusion from the two-layer extrusion die was so changed as to give the two layers-A and -B having the thickness set forth in Table 1, to give a metal foil-laminated polyimide film.

The adhesion strength and resistance to solder of the resulting metal foil-laminated polyimide film are set forth in Table 1.

COMPARISON EXAMPLE 3

The procedures of Example 1 were repeated except that the temperature of a hot press was changed to 250° C., to give a metal foil-laminated polyimide film.

The adhesion strength and resistance to solder of the resulting metal foil-laminated polyimide film are set forth in Table 1.

COMPARISON EXAMPLES 4 and 5

The procedures of Example 1 were repeated except for extruding the same first aromatic polyamic acid solutions through a one-layer extrusion die under the same conditions to give one-layer aromatic polyimide films having a secondary transition point of 285° C. and thickness of 7.5 μm and 25 μm, respectively. These films were named "R₂ type" and "R₃ type", respectively.

The procedures of Example 1 were further repeated except for extruding the same second aromatic polyamic acid solutions through a one-layer extrusion die under the same conditions to give one-layer aromatic polyimide films having no secondary transition point and thickness of 50 μm and 25 μm, respectively. These films were named "S₁ type" and "S₂ type", respectively.

On each of the S₁ type film and S₂ type film was placed each of the R₂ type film and R₃ type film, respectively. On the upper film was placed a copper foil of 35 μm thick, and then on the copper foil was placed an aluminum foil of 12 μm thick. The resulting composite films were pressed under heating in the same manner as stated in Example 1, to give metal foil-laminated polyimide films.

The adhesion strength and resistance to solder of the resulting metal foil-laminated polyimide films are set forth in Table 1.

TABLE 1

| | (Part 1) | | | | |
|---|---|---|---|---|---|
| | Ex. 1 | Ex. 2 | Ex. 3 | Ex. 4 | Ex. 5 |
| Layers of Film | Two | Two | Two | Two | Two |
| Thickness | | | | | |
| Total (μm) | 57.5 | 57.5 | 57.5 | 31.0 | 26.0 |
| Layer A (μm) | 50.0 | 50.0 | 50.0 | 26.0 | 25.0 |
| Layer B (μm) | 7.5 | 7.5 | 7.5 | 5.0 | 1.0 |
| Layer B' (μm) | — | — | — | — | — |
| Film Property | | | | | |
| Tensile Test | | | | | |
| Tensile Strength (kg/mm²) | 36.2 | 36.2 | 36.2 | 35.3 | 37.1 |
| Elongation (%) | 40 | 40 | 40 | 42 | 41 |
| Elasticity Modulus (kg/mm²) | 760 | 760 | 760 | 740 | 822 |
| Shrinkage Factor (TD, %) | 0.45 | 0.45 | 0.45 | 0.54 | 0.33 |
| Thermal Linear Expansion Coefficient (TD, ×10⁻⁵ cm/cm/°C.) | 1.8 | 1.8 | 1.8 | 1.7 | 1.3 |

TABLE 1-continued

|  |  |  |  |  |  |
|---|---|---|---|---|---|
| Metal Foil | Copper | Copper | Copper | Copper | Copper |
| Thickness (μm) | 35 | 35 | 35 | 35 | 35 |
| Number Used | One | One | One | One | One |
| Lamination Condition |  |  |  |  |  |
| Order of Lamination | Two-Cu | Two-Cu | Two-Cu | Two-Cu | Two-Cu |
| Temperature (°C.) | 400 | 400 | 350 | 400 | 400 |
| Pressure (kg/cm$^2$) | 400 | 100 | 100 | 400 | 400 |
| Laminated Film |  |  |  |  |  |
| Adhesion Strength (kg/cm) | 2.5 | 1.8 | 1.2 | 2.0 | 1.2 |
| Resistance to solder | Good | Good | Good | Good | Good |

(Part 2)

|  | Com. 1 | Com. 2 | Com. 3 | Com. 4 | Com. 5 |
|---|---|---|---|---|---|
| Layers of Film | One-R$_1$ | Two | Two | S$_1$-R$_2$ | S$_2$-R$_3$ |
| Thickness |  |  |  |  |  |
| Total (μm) | 50.0 | 30.2 | 57.5 | 50-7.5 | 25-25 |
| Layer A (μm) | — | 30.0 | 50.0 | — | — |
| Layer B (μm) | — | 0.2 | 7.5 | — | — |
| Layer B' (μm) | — | — | — | — | — |
| Film Property |  |  |  |  |  |
| Tensile Test |  |  |  |  |  |
| Tensile Strength (kg/mm$^2$) | 28.6 | 40.3 | 36.2 | — | — |
| Elongation (%) | 155 | 45 | 40 | — | — |
| Elasticity Modulus (kg/mm$^2$) | 380 | 832 | 760 | — | — |
| Shrinkage Factor (TD, %) | 1.80 | 0.41 | 0.45 | — | — |
| Thermal Linear Expansion Coefficient (TD, ×10$^{-5}$ cm/cm/°C.) | 3.2 | 0.7 | 1.8 | — | — |
| Metal Foil | Copper | Copper | Copper | Copper | Copper |
| Thickness (μm) | 35 | 35 | 35 | 35 | 35 |
| Number Used | One | One | One | One | One |
| Lamination Condition |  |  |  |  |  |
| Order of Lamination | R$_1$-Cu | Two-Cu | Two-Cu | S$_1$R$_2$Cu | S$_2$R$_3$Cu |
| Temperature (°C.) | 400 | 400 | 250 | 400 | 400 |
| Pressure (kg/cm$^2$) | 100 | 400 | 400 | 400 | 400 |
| Laminated Film |  |  |  |  |  |
| Adhesion Strength (kg/cm) | 2.0 | 0.1 | 0.3 | 0.5 | 0.6 |
| Resistance to solder | Swell | Good | Good | Poor | Swell |

EXAMPLES 6-11 AND COMPARISON EXAMPLES 6-8

The procedures of Example 1 were repeated except that various three layers polyimide films consisting of layer B, layer A, and layer B' were prepared using a three-layer extrusion die and the rates of extrusion from the three-layer extrusion die were so changed as to give the three layers B, A and B' having the thickness set forth in Table 2, to give metal foil-laminated polyimide films. The physical property (tensile strength, shrinkage factor on heating, thermal linear expansion coefficient) of the obtained film is set forth in Table 2.

On an aluminum foil of 12 μm thick, a copper foil of 35 μm thick was placed. On the copper foil, the polyimide film was placed. A copper foil of 35 μm thick was placed on the polyimide film. On the copper foil was placed an aluminum foil of 12 μm thick. The resulting composite film was placed in a hot press machine between heating plates, and pressed under the conditions set forth in Table 2.

The adhesion strength and resistance to solder of the resulting metal foil-laminated polyimide films are set forth in Table 2.

COMPARISON EXAMPLE 9

The procedures of Example 1 were repeated except for extruding the same second aromatic polyamic acid solution through a one-layer extrusion die under the same conditions to give a one-layer aromatic polyimide film having no secondary transition point and a thickness of 75 μm. This film was named "S$_3$ type".

The lamination procedures of Example 6 were repeated except that on R$_2$ type film prepared in Comparison Example 4 was placed the S$_3$ type film, and further, another R$_2$ type film was placed on the S$_3$ type film. The adhesion strength and resistance to solder of the resulting metal foil-laminated polyimide film are set forth in Table 2.

TABLE 2

|  | (Part 1) | | | | |
|---|---|---|---|---|---|
|  | Ex. 6 | Ex. 7 | Ex. 8 | Ex. 9 | Ex. 10 |
| Layers of Film | Three | Three | Three | Three | Three |
| Thickness |  |  |  |  |  |
| Total (μm) | 25.0 | 25.0 | 25.0 | 25.0 | 75.0 |
| Layer A (μm) | 15.0 | 15.0 | 15.0 | 15.0 | 55.0 |
| Layer B (μm) | 5.0 | 5.0 | 5.0 | 5.0 | 10.0 |
| Layer B' (μm) | 5.0 | 5.0 | 5.0 | 5.0 | 10.0 |

TABLE 2-continued

| Film Property | | | | | |
|---|---|---|---|---|---|
| Tensile Test | | | | | |
| Tensile Strength (kg/mm$^2$) | 25.0 | 25.0 | 25.0 | 25.0 | 29.0 |
| Elongation (%) | 32 | 32 | 32 | 32 | 34 |
| Elasticity Modulus (kg/mm$^2$) | 608 | 608 | 608 | 608 | 667 |
| Shrinkage Factor (TD, %) | 0.65 | 0.65 | 0.65 | 0.65 | 0.52 |
| Thermal Linear Expansion Coefficient (TD, $\times 10^{-5}$ cm/cm/°C.) | 2.1 | 2.1 | 2.1 | 2.1 | 1.7 |
| Metal Foil | Copper | Copper | Copper | Copper | Copper |
| Thickness (μm) | 35 | 35 | 35 | 35 | 35 |
| Number Used | Two | Two | Two | Two | Two |
| Lamination Condition | | | | | |
| Order of Lamination | | | Cu - Three - Cu | | |
| Temperature (°C.) | 400 | 400 | 400 | 350 | 400 |
| Pressure (kg/cm$^2$) | 400 | 450 | 350 | 150 | 400 |
| Laminated Film | | | | | |
| Adhesion Strength (kg/cm) | 1.8 | 1.8 | 1.5 | 1.1 | 2.2 |
| Resistance to solder | Good | Good | Good | Good | Good |

| (Part 2) | Ex. 11 | Com. 6 | Com. 7 | Com. 8 | Com. 9 |
|---|---|---|---|---|---|
| Layers of Film | Three | Three | Three | Three | S$_3$, R$_2$ |
| Thickness | | | | | |
| Total (μm) | 25.0 | 25.0 | 75.0 | 25.2 | 7.5, 7.5 |
| Layer A (μm) | 23.0 | 5.0 | 55.0 | 25.0 | — |
| Layer B (μm) | 1.0 | 10.0 | 10.0 | 0.1 | — |
| Layer B' (μm) | 1.0 | 10.0 | 10.0 | 0.1 | — |
| Film Property | | | | | |
| Tensile Test | | | | | |
| Tensile Strength (kg/mm$^2$) | 36.0 | 22.0 | 29.0 | 35.9 | — |
| Elongation (%) | 42 | 48 | 34 | 39 | — |
| Elasticity Modulus (kg/mm$^2$) | 820 | 550 | 667 | 873 | — |
| Shrinkage Factor (TD, %) | 0.25 | 1.20 | 0.52 | 0.16 | — |
| Thermal Linear Expansion Coefficient (TD, $\times 10^{-5}$ cm/cm/°C.) | 1.4 | 2.9 | 1.7 | 1.6 | — |
| Metal Foil | Copper | Copper | Copper | Copper | Copper |
| Thickness (μm) | 35 | 35 | 35 | 35 | 35 |
| Number Used | Two | Two | Two | Two | Two |
| Lamination Condition | | | | | |
| Order of Lamination | | | Cu - Three - Cu | | CuR$_2$S$_3$R$_2$Cu |
| Temperature (°C.) | 400 | 400 | 250 | 400 | 400 |
| Pressure (kg/cm$^2$) | 400 | 400 | 400 | 400 | 400 |
| Laminated Film | | | | | |
| Adhesion Strength (kg/cm) | 1.3 | 2.0 | 0.5 | 0.3 | 0.2 |
| Resistance to solder | Good | Swell | Good | Poor | Poor |

EXAMPLE 12

3,3'4,4'-Biphenyltetracarboxylic dianhydride (s-BPDA) and 4,4'-diaminodiphenylether (DADE) were polymerized in N,N-dimethylacetamide (DMAc) to give a first aromatic polyamic acid solution having a polymer content of 18 weight % and a solution viscosity of 5,000 poises.

Independently, s-BPDA and p-phenylenediamine (PPD) were polymerized to give a second aromatic polyamic acid solution having a polymer content of 18 weight % and a solution viscosity of 4,500 poises.

The first and second polyamic acid solutions were simultaneously excluded through a two-layer extrusion die onto a metal support having a planar surface. The excluded solutions were cast on the support and continuously dried at 140° C. using a blower to give a self-supporting solid film containing 35 weight % of solvent. The solid film was peeled from the support and heated in a heating furnace at temperatures gradually elevating from 200° C. to 550° C., whereby removing the solvent and imidizing the polymer. Thus, a continuous (long) polyimide film consisting of two aromatic polyimide layers and having a width of 20 cm was produced. The physical property (tensile strength, shrinkage factor on heating, thermal linear expansion coefficient) of the obtained film is set forth in Table 3.

The obtained film consisted of a high heat-resistant aromatic polyimide layer having no secondary transition point and a thickness of 32 μm (corresponding to layer A) and an aromatic polyimide layer having a secondary transition point at 280° C. and a thickness of 3 μm (corresponding to layer B).

Then, lamination of a metal foil on the polyimide film was performed using a hot press machine illustrated in FIG. 8.

The polyimide film was supplied from the roll 87 in the manner that the layer B was positioned above the layer A. Simultaneously, a continuous copper foil having a thickness of 35 μm was supplied from the roll 36.

The polyimide film and copper foil were combined using the expander roll 81 and guide roll 82, and then passed through the clearance between the heat press rolls 83, 84 having the same temperature. By the heat press rolls, the copper foil was pressed onto the polyimide film under the conditions set forth in Table 3 to give a polyimide film laminated with a metal foil.

The resulting metal foil-laminated polyimide film was subjected to measurement of adhesion strength (90°-peeling, room temperature) and resistance to solder. The results are set forth in Table 3.

EXAMPLE 13

The procedures of Example 12 were repeated except that the heat press conditions were changed as set forth in Table 3, to give a metal foil-laminated polyimide film.

The adhesion strength and resistance to solder of the resulting metal foil-laminated polyimide film are set forth in Table 3.

EXAMPLE 14

The procedures of Example 12 were repeated except that the rate of extrusion from the two-layer extrusion die was so changed as to give the two layers A and B having the thickness set forth in Table 3, to give a metal foil-laminated polyimide film.

The adhesion strength and resistance to solder of the resulting metal foil-laminated polyimide film are set forth in Table 3.

EXAMPLES 15–18

The procedures of Example 12 were repeated except that various three layers polyimide films consisting of layer B, layer A, and layer B' were prepared using a three-layer extrusion die and the rates of extrusion from the three-layer extrusion die were so changed as to give the three layers B, A and B' having the thickness set forth in Table 3, to give metal foil-laminated polyimide films. The physical property (tensile strength, shrinkage factor on heating, thermal linear expansion coefficient) of the obtained film is set forth in Table 3.

The above three-layer polyimide film, a long copper foil, and another long copper foil of the same type were supplied from rolls 87, 86 and 88, respectively, to laminate the copper foils on both sides of the polyimide film in the hot press machine under the conditions set forth in Table 3.

The adhesion strength and resistance to solder of the resulting metal foil-laminated polyimide films are set forth in Table 3.

COMPARISON EXAMPLES 10 and 11

The procedures of Example 12 were repeated except for extruding the same first aromatic polyamic acid solution through a one-layer extrusion die under the same conditions to give a one-layer aromatic polyimide film having a secondary transition point of 280° C. and a thickness of 75 $\mu$m. This film was named "$R_4$ type".

The physical property of $R_4$ type film is set forth in Table 3.

The lamination procedure of Example 12 were then repeated except that the $R_4$ type film was used and the pressure for adhesion set forth in Table 3 was employed, to give a metal foil-laminated polyimide film.

The adhesion strength and resistance to solder of the resulting metal foil-laminated polyimide film are set forth in Table 3.

COMPARISON EXAMPLE 12

The procedures of Example 12 were repeated except for extruding the same first aromatic polyamic acid solution through a one-layer extrusion die under the same conditions to give a one-layer aromatic polyimide film having a secondary transition point of 285° C. and a thickness of 15 $\mu$m. This film was named "$R_5$ type".

The procedures of Example 12 were further repeated except for extruding the same second aromatic polyamic acid solutions through a one-layer extrusion die under the same conditions to give a one-layer aromatic polyimide film having no secondary transition point and thickness of 60 $\mu$m. This film was named "$S_4$ type".

The procedures of lamination of Example 12 were repeated except that the $S_4$ type film, $R_5$ type film, and a long copper foil were supplied from rolls 88, 87, and 86, respectively.

The adhesion strength and resistance to solder of the resulting metal foil-laminated polyimide films are set forth in Table 3.

TABLE 3

| | (Part 1) | | | | |
|---|---|---|---|---|---|
| | Ex. 12 | Ex. 13 | Ex. 14 | Ex. 15 | Ex. 16 |
| Layers of Film | Two | Two | Two | Three | Three |
| Thickness | | | | | |
| Total ($\mu$m) | 35.0 | 35.0 | 25.0 | 25.0 | 75.0 |
| Layer A ($\mu$m) | 32.0 | 32.0 | 24.0 | 15.0 | 55.0 |
| Layer B ($\mu$m) | 3.0 | 3.0 | 1.0 | 5.0 | 10.0 |
| Layer B' ($\mu$m) | — | — | — | 5.0 | 10.0 |
| Film Property | | | | | |
| Tensile Test | | | | | |
| Tensile Strength (kg/mm$^2$) | 45.9 | 45.9 | 41.5 | 25.0 | 29.0 |
| Elongation (%) | 41 | 41 | 39 | 32 | 34 |
| Elasticity Modulus (kg/mm$^2$) | 830 | 830 | 870 | 608 | 667 |
| Shrinkage Factor (TD, %) | 0.30 | 0.30 | 0.28 | 0.65 | 0.52 |
| Thermal Linear Expansion Coefficient (TD, $\times 10^{-5}$ cm/cm/°C.) | 1.3 | 1.3 | 1.0 | 2.1 | 1.7 |
| Metal Foil | Copper | Copper | Copper | Copper | Copper |
| Thickness ($\mu$m) | 35 | 35 | 35 | 35 | 35 |
| Lamination Condition | | | | | |
| Order of Lamination | Two-Cu | Two-Cu | Two-Cu | Cu - Three - Cu | |
| Temperature (°C.) | 380 | 350 | 350 | 380 | 380 |
| Linear Pressure (kg/cm$^2$) | 150 | 150 | 150 | 200 | 350 |

TABLE 3-continued

|  |  |  |  |  |  |
|---|---|---|---|---|---|
| Pick-up rate (cm/min) | 30 | 30 | 30 | 30 | 30 |
| Laminated Film | | | | | |
| Adhesion Strength (upper) | 2.0 | 1.0 | 0.7 | 3.3 | 3.7 |
| (kg/cm) (lower) | — | — | — | 2.8 | 3.5 |
| Resistance to solder | Good | Good | Good | Good | Good |

| (Part 2) | Ex. 17 | Ex. 18 | Com. 10 | Com. 11 | Com. 12 |
|---|---|---|---|---|---|
| Layers of Film | Three | Three | $R_4$ | $R_4$ | $S_4$-$R_5$ |
| Thickness | | | | | |
| Total (μm) | 75.0 | 75.0 | — | 75.0 | 60-15 |
| Layer A (μm) | 55.0 | 55.0 | — | — | — |
| Layer B (μm) | 10.0 | 10.0 | — | — | — |
| Layer B' (μm) | 10.0 | 10.0 | — | — | — |
| Film Property | | | | | |
| Tensile Test | | | | | |
| Tensile Strength (kg/mm²) | 29.0 | 29.0 | 32.1 | 32.1 | — |
| Elongation (%) | 34 | 34 | 129 | 129 | — |
| Elasticity Modulus (kg/mm²) | 667 | 667 | 370 | 370 | — |
| Shrinkage Factor (TD, %) | 0.52 | 0.52 | 2.10 | 2.10 | — |
| Thermal Linear Expansion Coefficient (TD, ×10⁻⁵ cm/cm/°C.) | 1.7 | 1.7 | 4.0 | 4.0 | — |
| Metal Foil | Copper | Copper | Copper | Copper | Copper |
| Thickness (μm) | 35 | 35 | 35 | 35 | 35 |
| Lamination Condition | | | | | |
| Order of Lamination | Cu - Three - Cu | | Cu-$R_4$-Cu | | $S_4R_5$Cu |
| Temperature (°C.) | 350 | 300 | 420 | 380 | 350 |
| Linear Pressure (kg/cm) | 350 | 350 | 200 | 200 | 200 |
| Pick-up rate (cm/min) | 30 | 30 | 30 | 30 | 30 |
| Laminated Film | | | | | |
| Adhesion Strength (upper) | 2.5 | 0.6 | 3.6 | 3.5 | 1.2 |
| (kg/cm) (lower) | 2.5 | 0.8 | 3.1 | 3.8 | — |
| Resistance to solder | Good | Good | Swell | Swell | Swell |

We claim:

1. A laminate of an aromatic polyimide substrate film and a metal foil said substrate film obtainable by:
   (a) simultaneously extruding superposed first and second solution layers onto a planar support, the first solution layer being a solution of a polyamic acid derived from an aromatic tetracarboxylic acid or its derivative and a phenylene diamine; and the second solution layer being a solution of a polyamic acid derived from an aromatic tetracarboxylic acid or its derivative and an aromatic diamine having plural benzene rings to form a two-layer film of the two solution layers;
   (b) drying the thus formed film to obtain a self-supporting film composed of first and second layers corresponding to the first and second solution layers;
   (c) heating the dried film to convert the polyamic acids to their respective polyimides, such that the films cannot be peeled from one another along their interface; and
   (d) fixing a metal foil layer onto the exposed surface of the second film layer under pressure at a temperature from 280°–550° C., in the absence of an adhesive, wherein the thickness of the first film is from 6 to 200 μm and constitutes at least 55% of the total thickness of the substrate, and the thickness of the second film is from 0.2 to 15 μm.

2. The aromatic polyimide film laminated with a metal foil as defined in claim 1, wherein the layer made of an aromatic polyimide which is derived from an aromatic tetracarboxylic acid or its derivative and an aromatic diamine having plural benzene rings has a thickness of 0.3–15 μm.

3. The aromatic polyimide film laminated with a metal foil as defined in claim 1, wherein the layer made of an aromatic polyimide which is derived from an aromatic tetracarboxylic acid or its derivative and an aromatic diamine having plural benzene rings has a secondary order transition point in the range of 250°–400° C.

4. A laminate of an aromatic polyimide substrate film and metal foil, the said substrate film obtainable by:
   (a) simultaneously extruding superposed first, second and third solution layers onto a planar support, the first and third layers being a solution of a polyamic acid derived from an aromatic tetracarboxylic acid and an aromatic diamine having plural benzene rings and the second layer being a solution of a polyamic acid derived from an aromatic tetracarboxylic acid or its derivative and a phenylene diamine to form a three-layer film of the three solution layers;
   (b) drying the thus formed film to obtain a self-supporting film composed of the first, second and third layers corresponding to the first, second, and third solution layers;
   (c) heating the dried film to convert the polyamic acids to their respective polyimides, such that the films cannot be peeled from one another along their interface; and
   (d) fixing metal foil layers onto the exposed surfaces of the first and third film layers under pressure at a pressure from 280°–550° C., in the absence of an adhesive, wherein the thickness of the second film is from 6 to 200 μm and the thickness of the first and third layers is from 0.2 to 15 μm.

5. The aromatic polyimide film laminated with a metal foil as defined in claim 1 or 4, the aromatic tetracarboxylic acid or its derivative is selected from the group consisting of 2,3,3',4'-biphenyltetracarboxylic acid, its dianhydride, 3,3',4,4'-biphenyltetracarboxylic acid, its dianhydride, 3,3',4,4'-benzophenonetetracarboxylic acid, its dianhydride, 3,3',4,4'-diphenylethertetracarboxylic acid, and its dianhydride.

* * * * *